United States Patent
Chen et al.

(10) Patent No.: US 10,973,322 B1
(45) Date of Patent: Apr. 13, 2021

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/881,291

(22) Filed: May 22, 2020

(30) Foreign Application Priority Data

Dec. 16, 2019 (TW) .................................. 108146320

(51) Int. Cl.
*H05K 7/14* (2006.01)
*A47B 88/493* (2017.01)
*A47B 88/477* (2017.01)

(52) U.S. Cl.
CPC .......... *A47B 88/493* (2017.01); *A47B 88/477* (2017.01); *A47B 2210/0018* (2013.01); *A47B 2210/0081* (2013.01); *H05K 7/1489* (2013.01)

(58) Field of Classification Search
CPC ... A47B 88/493; A47B 88/477; H05K 7/1489
See application file for complete search history.

(56) References Cited

U.S. PATENT DOCUMENTS

| | | | |
|---|---|---|---|
| 9,967,997 B1 | 5/2018 | Shen et al. | |
| 10,213,017 B2 | 2/2019 | Chen et al. | |
| 10,413,065 B2 | 9/2019 | Chen et al. | |
| 10,413,066 B2 | 9/2019 | Chen et al. | |
| 10,477,965 B1 | 11/2019 | Chen et al. | |
| 10,555,607 B2 | 2/2020 | Chen et al. | |
| 10,646,038 B2* | 5/2020 | Chen | A47B 88/427 |
| 2019/0200756 A1* | 7/2019 | Chen | A47B 88/40 |
| 2019/0335903 A1* | 11/2019 | Chen | A47B 88/427 |

FOREIGN PATENT DOCUMENTS

| | | | |
|---|---|---|---|
| EP | 3202283 A1 | 8/2017 | |
| EP | 3567994 A1 | 11/2019 | |

OTHER PUBLICATIONS

EP Search Report dated Nov. 19, 2020 for corresponding EP Patent Application No. 20179438.5.

* cited by examiner

*Primary Examiner* — Kimberley S Wright
(74) *Attorney, Agent, or Firm* — Rosenberg, Klein & Lee

(57) ABSTRACT

A slide rail assembly includes a first rail and a second rail. The first rail has a plurality of walls and is provided with a blocking feature, wherein the walls jointly define a channel. The second rail is provided with a foolproof feature. When the second rail, after being turned through a predetermined angle with respect to the first rail, is mounted into the channel from outside the channel, the foolproof feature and the blocking feature block each other to prevent the second rail from being retracted with respect to the first rail.

5 Claims, 11 Drawing Sheets

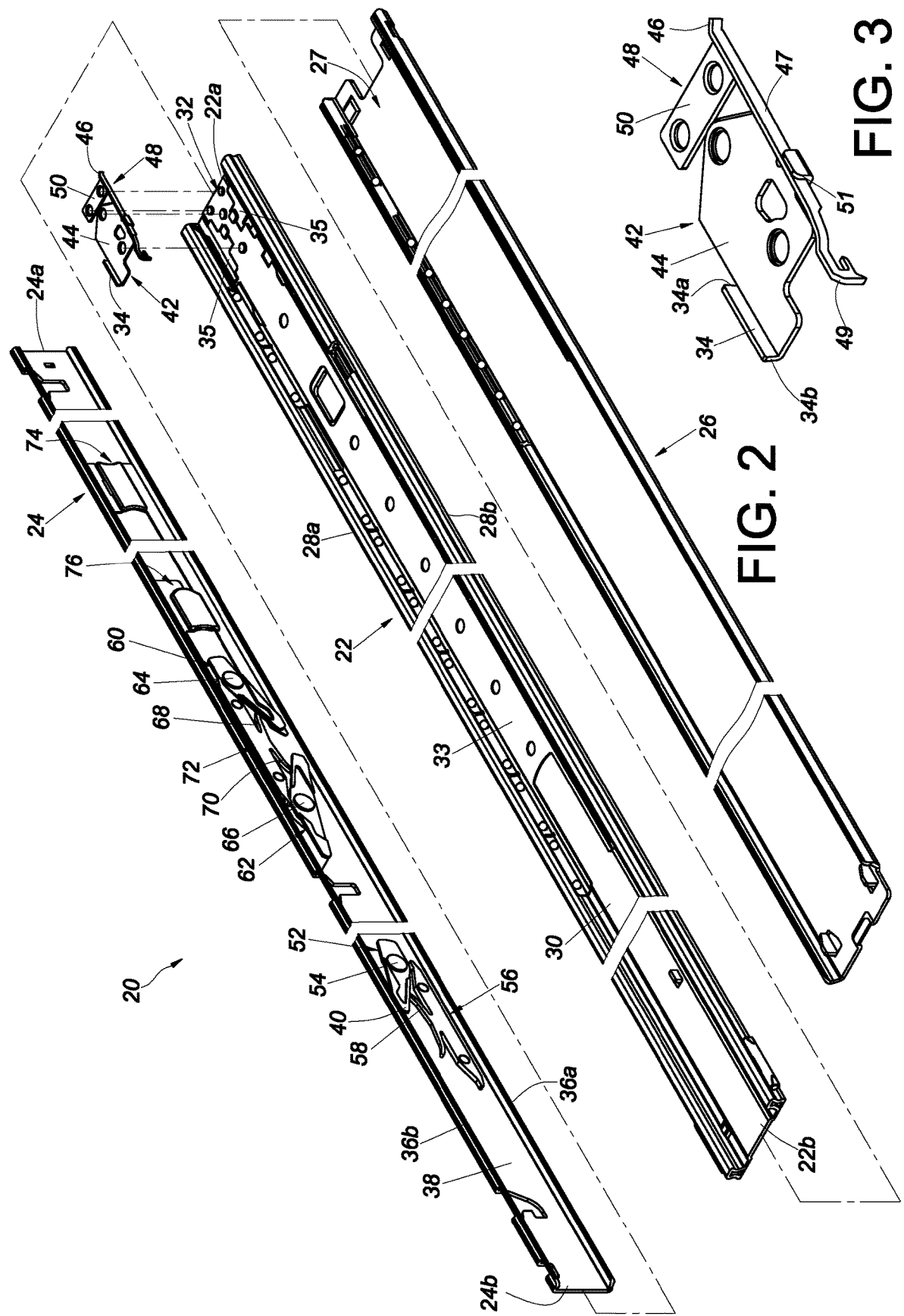

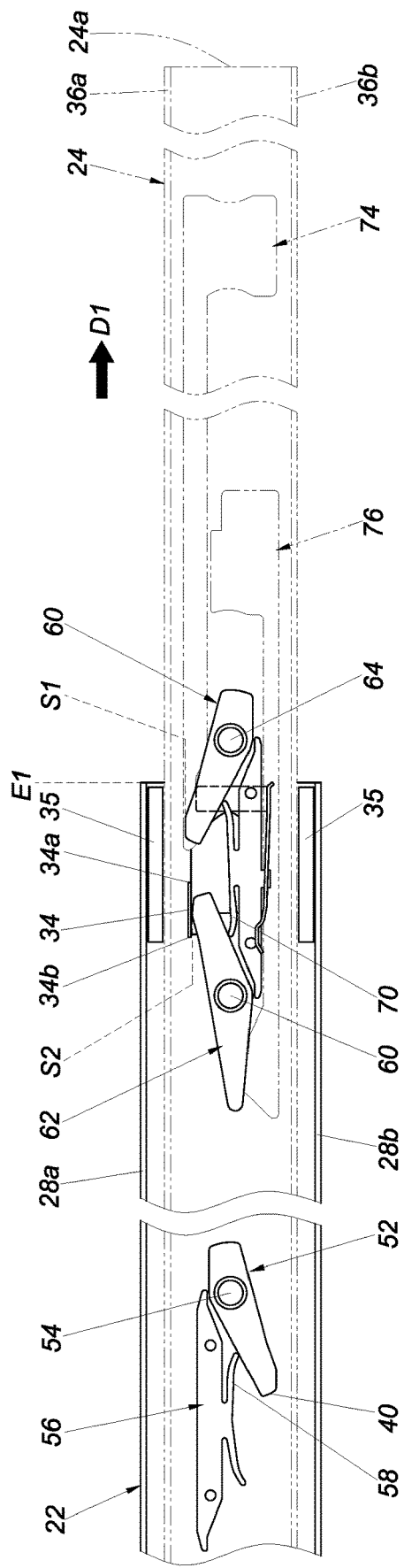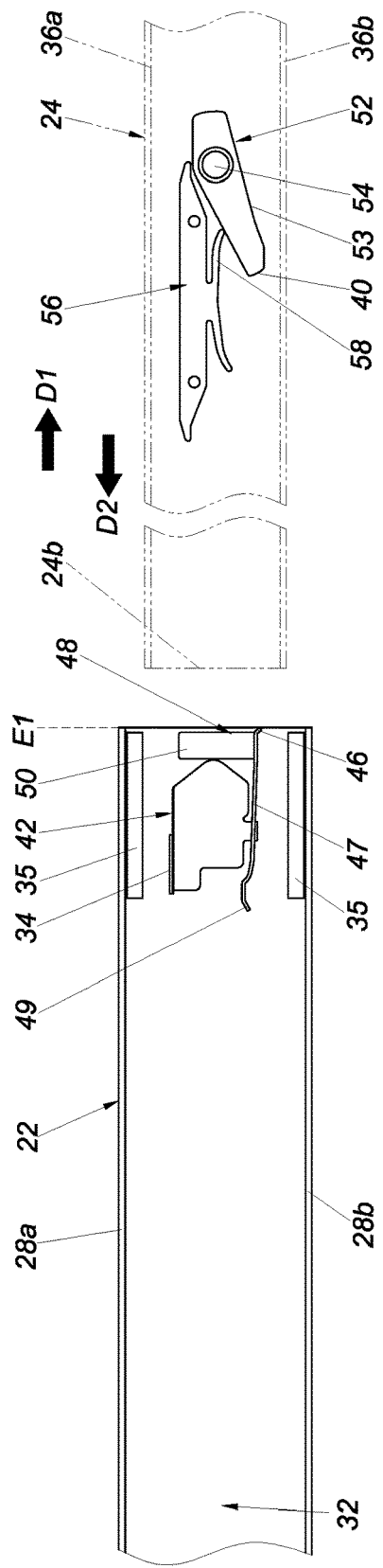
FIG. 10
FIG. 11

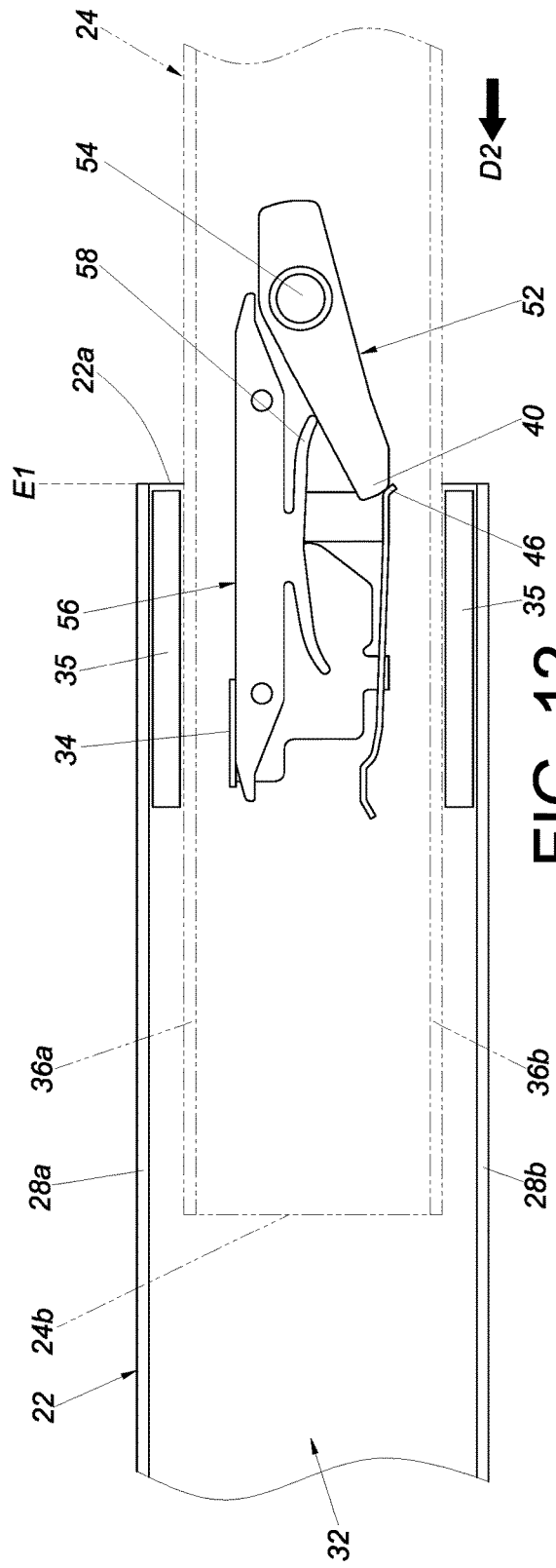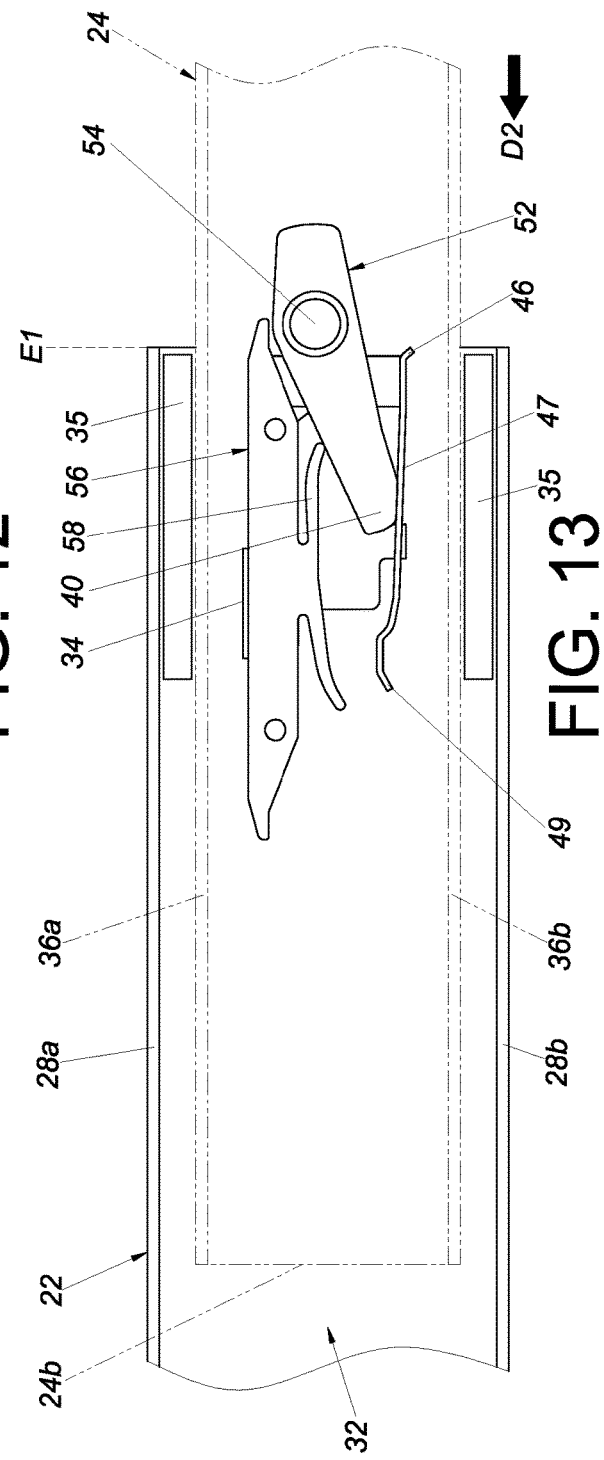

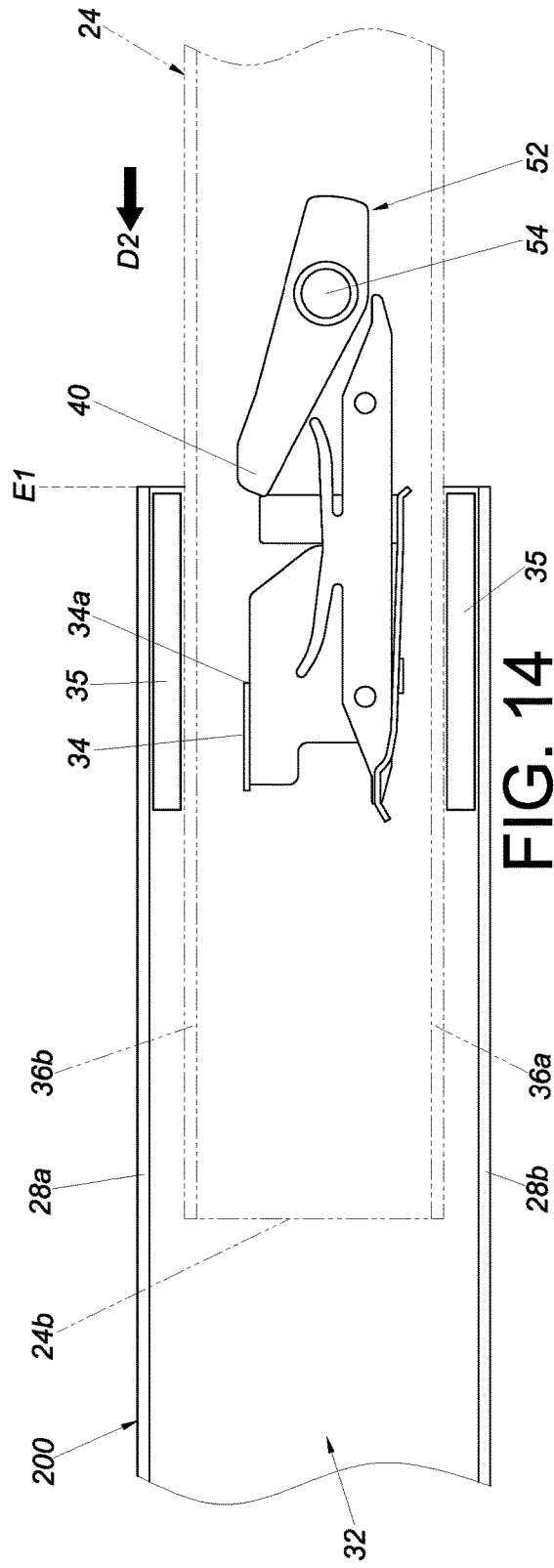
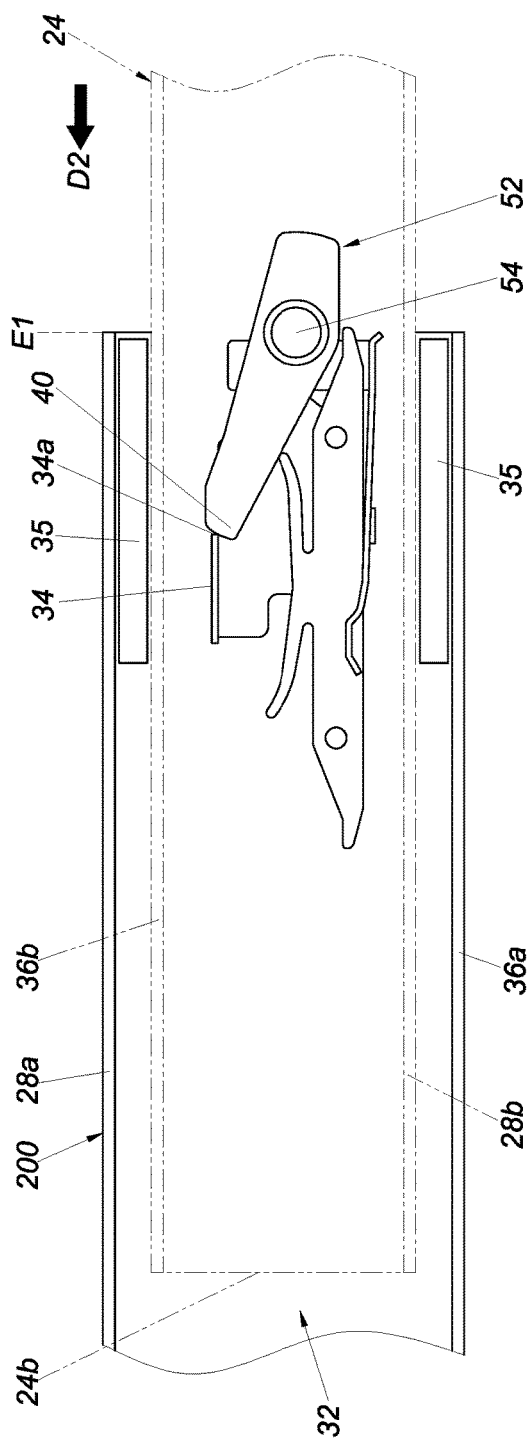

SLIDE RAIL ASSEMBLY

FIELD OF THE INVENTION

The present invention relates to a slide rail and more particularly to a slide rail assembly with a foolproof function.

BACKGROUND OF THE INVENTION

Generally, a slide rail assembly includes a plurality of slide rails, say a first rail and a second rail that can be displaced with respect to each other, wherein the first rail has a channel for receiving the second rail. Sometimes there may be particular requirements by which mounting the second rail incorrectly into the channel of the first rail is not allowed. For example, to prevent errors in mounting precision or other problems, certain server chassis may require that slide rail assemblies that are intended to be mounted respectively on the left and right sides of the chassis body be mounted exactly as intended: the second rail of the left-side slide rail assembly must not be mounted in the first rail of the right-side slide rail assembly, and the second rail of the right-side slider rail assembly must not be mounted in the first rail of the left-side slide rail assembly. It is therefore important to develop a slide rail assembly that can prevent two slide rails thereof from being mounted erroneously with respect to each other.

SUMMARY OF THE INVENTION

The present invention provides a slide rail assembly that has a foolproof mechanism.

According to one aspect of the present invention, a slide rail assembly includes a first rail, a blocking feature, a second rail, and a foolproof feature. The first rail has a first wall, a second wall, and a longitudinal wall connected between the first wall and the second wall of the first rail. The first wall, the second wall, and the longitudinal wall of the first rail jointly define a channel. The blocking feature is provided on the first rail and is adjacent to the first wall of the first rail. The second rail has a first wall, a second wall, and a longitudinal wall connected between the first wall and the second wall of the second rail. The foolproof feature is provided on the second rail and is adjacent to the second wall of the second rail. In the course in which the second rail is inserted into the channel of the first rail, with the first wall of the second rail being adjacent to the second wall of the first rail, the foolproof feature and the blocking feature block each other to prevent the second rail from being retracted with respect to the first rail.

Preferably, in the course in which the second rail is inserted into the channel of the first rail in a retracting direction from outside the channel of the first rail, with the first wall of the second rail being adjacent to the first wall of the first rail, the foolproof feature and the blocking feature do not block each other and therefore allow the second rail to be retracted with respect to the first rail.

Preferably, the slide rail assembly further includes a blocking member. The blocking member is fixed on the first rail, is adjacent to the front end of the first rail, and has the blocking feature.

Preferably, the slide rail assembly further includes a foolproof member. The foolproof member is movably mounted on the second rail and has the foolproof feature.

Preferably, the foolproof member is pivotally connected to the second rail.

Preferably, the slide rail assembly further includes an elastic member for applying an elastic force to the foolproof member.

Preferably, the foolproof member stays in a predetermined state in response to the elastic force generated by the elastic member.

Preferably, the slide rail assembly further includes a guiding feature adjacent to the second wall of the first rail. In the course in which the second rail is inserted into the channel of the first rail, with the first wall of the second rail being adjacent to the first wall of the first rail, the foolproof member is guided and moved by the guiding feature and consequently moves past the guiding feature such that the second rail is allowed to be retracted with respect to the first rail.

Preferably, the slide rail assembly further includes a first working member and a second working member, both movably mounted on the second rail. When the second rail reaches an extended position after being displaced with respect to the first rail from a retracted position in an opening direction, the first working member and the second working member are located respectively at a first portion and a second portion of the blocking feature to keep the second rail at the extended position.

Preferably, the first working member is pivotally connected to the second rail by a first shaft, and the second working member is pivotally connected to the second rail by a second shaft.

Preferably, the slide rail assembly further includes a first elastic feature for applying an elastic force to the first working member and a second elastic feature for applying an elastic force to the second working member.

Preferably, the slide rail assembly further includes a first operating member and a second operating member. The first operating member and the second operating member are connected to the first working member and the second working member respectively in such that way that each of the first operating member and the second operating member can be operated to operate the corresponding one of first working member and the second working member.

According to another aspect of the present invention, a slide rail assembly includes two first rails and a second rail. The two first rails have substantially the same structural configurations. Each first rail defines a channel and is provided with a blocking feature. The second rail is provided with a foolproof feature. In the course in which the second rail is inserted into the channel of one of the two first rails in a retracting direction from outside the channel of the one of the two first rails, the foolproof feature and the blocking feature of the one of the two first rails do not block each other and therefore allow the second rail to be retracted with respect to the one of the two first rails in the retracting direction. In the course in which the second rail, after being turned through a predetermined angle with respect to the other of the two first rails, is inserted into the channel of the other of the two first rails in the retracting direction from outside the channel of the other of the two first rails, the foolproof feature and the blocking feature of the other of the two first rails block each other to prevent the second rail from being retracted with respect to the other of the two first rails in the retracting direction.

Preferably, the predetermined angle is substantially 180 degrees.

Preferably, each first rail has a first wall, a second wall, and a longitudinal wall connected between the first wall and the second wall of the first rail; the first wall, the second wall, and the longitudinal wall of each first rail jointly define the channel of the first rail; and the blocking feature of each first rail is adjacent to the first wall of the first rail.

Preferably, the second rail has a first wall, a second wall, and a longitudinal wall connected between the first wall and the second wall of the second rail, and the foolproof feature is adjacent to the second wall of the second rail.

Preferably, each first rail is provided with a blocking member adjacent to the front end of the first rail, the blocking member of each first rail has the blocking feature of the first rail, the slide rail assembly includes a foolproof member movably mounted on the second rail and having the foolproof feature, and the slide rail assembly further includes an elastic member for applying an elastic force to the foolproof member.

BRIEF DESCRIPTION OF THE DRAWINGS

FIG. 2 is an exploded perspective view of the slide rail assembly according to the embodiment of the present invention;

FIG. 3 is a schematic view showing the blocking member and the elastic base of the slide rail assembly according to the embodiment of the present invention;

FIG. 10 is a schematic view of the slide rail assembly according to the embodiment of the present invention, showing that the slide rail assembly is in the extended state, and that the second rail is displaced in the opening direction through the movement of the aforesaid working member;

FIG. 11 is a schematic view of the slide rail assembly according to the embodiment of the present invention, showing that the second rail of the slide rail assembly is detached from the first rail in the opening direction;

FIG. 12 is a schematic view of the slide rail assembly according to the embodiment of the present invention, showing how the second rail of the slide rail assembly is mounted back to the first rail in a retracting direction;

FIG. 13 is a schematic view of the slide rail assembly according to the embodiment of the present invention, showing that the second rail of the slide rail assembly is further displaced in the retracting direction while being mounted to the first rail;

FIG. 14 is a schematic view of the slide rail assembly according to the embodiment of the present invention, showing that the slide rail assembly has a foolproof feature, and that the second rail of the slide rail assembly is being mounted to another first rail in the retracting direction; and FIG. 15 is a schematic view of the slide rail assembly according to the embodiment of the present invention, showing that the foolproof feature of the slide rail assembly prevents the second rail from being further displaced in the retracting direction and hence from being mounted to the another first rail.

DETAILED DESCRIPTION OF THE INVENTION

Figure 1:
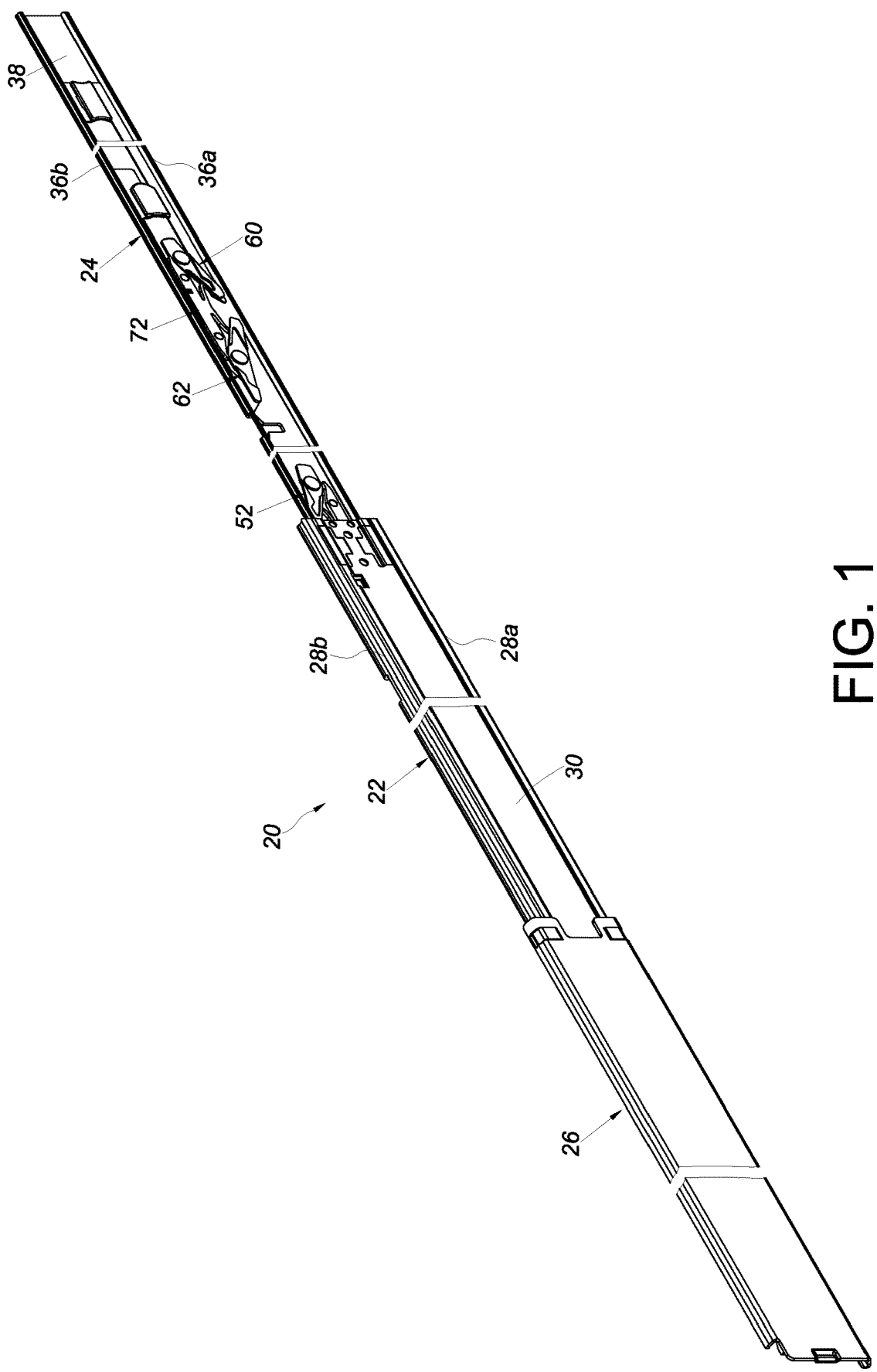
FIG. 1 is a perspective view of the slide rail assembly according to an embodiment of the present invention, showing the slide rail assembly in an extended state.

Referring to FIG. 1 and FIG. 2, the slide rail assembly 20 according to an embodiment of the present invention includes a first rail 22, a second rail 24, and preferably also a third rail 26. The first rail 22 is movably mounted between the third rail 26 and the second rail 24.

The third rail 26 includes a plurality of walls that jointly define a channel 27 for receiving the first rail 22.

The first rail 22 can be longitudinally displaced with respect to the third rail 26. The first rail 22 has a front end 22a and a rear end 22b. The first rail 22 includes a first wall 28a, a second wall 28b, and a longitudinal wall 30 connected between the first wall 28a and the second wall 28b of the first rail 22. The first wall 28a, the second wall 28b, and the longitudinal wall 30 of the first rail 22 jointly define a channel 32 for receiving the second rail 24. Preferably, the first rail 22 further includes a slide facilitating device 33 movably provided in the channel 32 of the first rail 22 to facilitate displacement of the second rail 24 with respect to the first rail 22. The first rail 22 is provided with a blocking feature 34. The blocking feature 34 is located in the channel 32 of the first rail 22 and is adjacent to the first wall 28a of the first rail 22. The first rail 22 is further provided with a pair of guide blocks 35 at the front end 22a. The guide blocks 35 abut against the first wall 28a and the second wall 28b of the first rail 22 respectively and are configured to not only block the slide facilitating device 33, but also support and guide the second rail 24 while the second rail 24 is being inserted into the first rail 22.

The second rail 24 has a front end 24a and a rear end 24b. The second rail 24 includes a first wall 36a, a second wall 36b, and a longitudinal wall 38 connected between the first wall 36a and the second wall 36b of the second rail 24. The rear end 24b of the second rail 24 can be inserted into the front end 22a of the first rail 22 so that the second rail 24 is longitudinally displaceable with respect to the first rail 22. The second rail 24 is provided with a foolproof feature 40. The foolproof feature 40 is adjacent to the second wall 36b of the second rail 24.

Preferably, the slide rail assembly 20 includes a blocking member 42 (see also FIG. 3) fixed on the first rail 22 at a position adjacent to the front end 22a, and the blocking member 42 includes the blocking feature 34. More specifically, the blocking member 42 includes a main body portion 44 connected (e.g., fixedly connected) to the longitudinal wall 30 of the first rail 22, and the blocking feature 34 protrudes transversely (or laterally) with respect to the main body portion 44.

Preferably, the slide rail assembly 20 includes a guiding feature 46 (see also FIG. 3) adjacent to the second wall 28b of the first rail 22. The guiding feature 46 includes an inclined surface or a curved surface. The guiding feature 46 may be integrated with the first rail 22 or, as in this embodiment by way of example, be integrated with an elastic base 48. More specifically, the elastic base 48 has a connecting portion 50 connected (e.g., fixedly connected) to the longitudinal wall 30 of the first rail 22, and the guiding feature 46 is adjacent to the connecting portion 50.

Preferably, the elastic base 48 includes an elastic arm 47 connected to the connecting portion 50 (see also FIG. 3), and the two opposite ends of the elastic arm 47 are provided with the guiding feature 46 and an engaging portion 49 respectively. When the second rail 24 is pulled out with respect to the first rail 22 and thereby displaces the slide facilitating device 33 to a position adjacent to the front end 22a of the first rail 22, the engaging portion 49 is brought into engagement with a predetermined portion of the slide facilitating device 33 to stop the slide facilitating device 33 temporarily at the front end 22a. The blocking member 42 further includes a supporting portion 51 for supporting the elastic arm 47.

Figure 4:
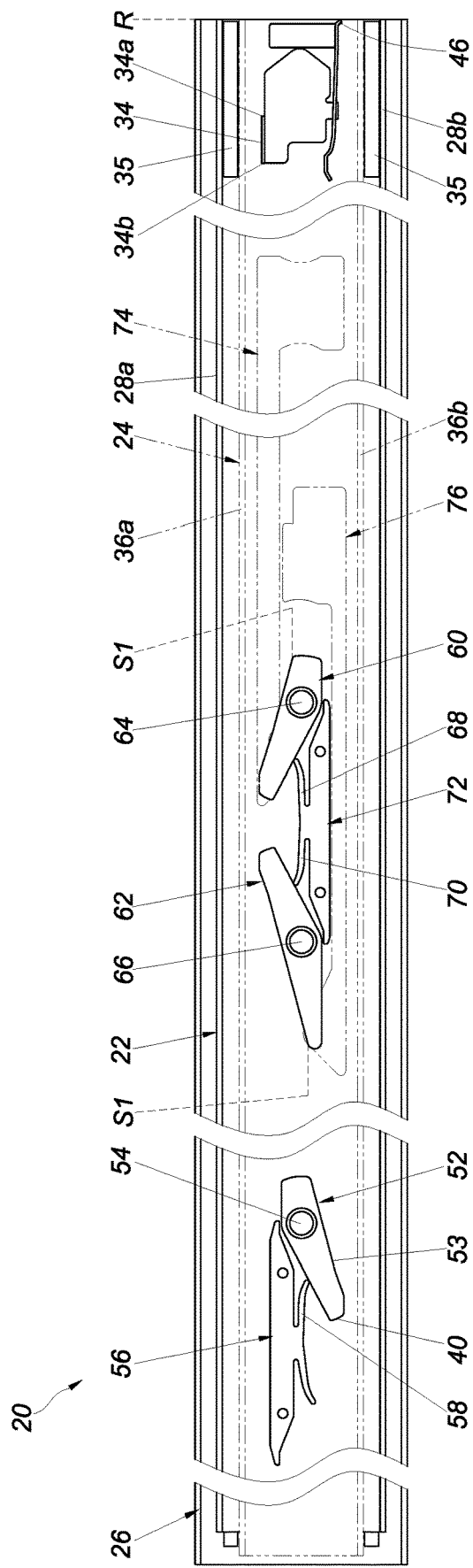
FIG. 4 is a schematic view of the slide rail assembly according to the embodiment of the present invention, showing the slide rail assembly is in a retracted state.

Preferably, referring also to FIG. 4, the slide rail assembly 20 includes a foolproof member 52 movably mounted on the second rail 24, and the foolproof member 52 has the foolproof feature 40. Here, by way of example, the foolproof member 52 is pivotally connected to the longitudinal wall 38 of the second rail 24 by a connecting shaft 54. The foolproof member 52 also has a guiding surface 53, which may be an inclined surface or a curved surface without limitation.

Preferably, the slide rail assembly 20 further includes an elastic member 56, and the foolproof member 52 is configured to stay in a predetermined state in response to the elastic force generated by the elastic member 56. Here, by way of example, the elastic member 56 has an elastic section 58 for applying an elastic force to the foolproof member 52.

Preferably, the slide rail assembly 20 includes a first working member 60 and a second working member 62, both movably mounted on the second rail 24. Here, by way of example, the first working member 60 is pivotally connected to the longitudinal wall 38 of the second rail 24 by a first shaft 64, and the second working member 62 is pivotally connected to the longitudinal wall 38 of the second rail 24 by a second shaft 66.

Preferably, the slide rail assembly 20 further includes a first elastic feature 68 for applying an elastic force to the first working member 60 and a second elastic feature 70 for applying an elastic force to the second working member 62. Here, by way of example, the first elastic feature 68 and the second elastic feature 70 are integrated into an elastic base 72, and each of the first elastic feature 68 and the second elastic feature 70 is an elastic arm. It is worth mentioning that, in other embodiments, the first elastic feature 68 and the second elastic feature 70 may be two independent elements disposed on the second rail 24; the present invention has no limitation in this regard.

Preferably, the slide rail assembly 20 includes an operating member for operating one of the first working member 60 and the second working member 62. Here, the slide rail assembly 20 includes a first operating member 74 and a second operating member 76 by way of example. The first operating member 74 and the second operating member 76 are connected respectively to the first working member 60 and the second working member 62 in an operable manner.

FIG. 4 shows the slide rail assembly 20 in a retracted state in which the first rail 22 has been retracted with respect to the third rail 26 and the second rail 24 is at a retracted position R with respect to the first rail 22. It is worth mentioning that the first wall 36a of the second rail 24 is adjacent to the first wall 28a of the first rail 22, and that the second wall 36b of the second rail 24 is adjacent to the second wall 28b of the first rail 22. The first working member 60 and the second working member 62 respond to the elastic force of the first elastic feature 68 and the elastic force of the second elastic feature 70 respectively by staying in a first working state S1, and both the first working member 60 and the second working member 62 correspond in position to the blocking feature 34 of the first rail 22. The foolproof member 52, on the other hand, does not correspond in position to the blocking feature 34 of the first rail 22; that is to say, the foolproof feature 40 is offset from the blocking feature 34. The blocking feature 34 has two opposite portions defined respectively as a first portion 34a and a second portion 34b.

Figure 5:
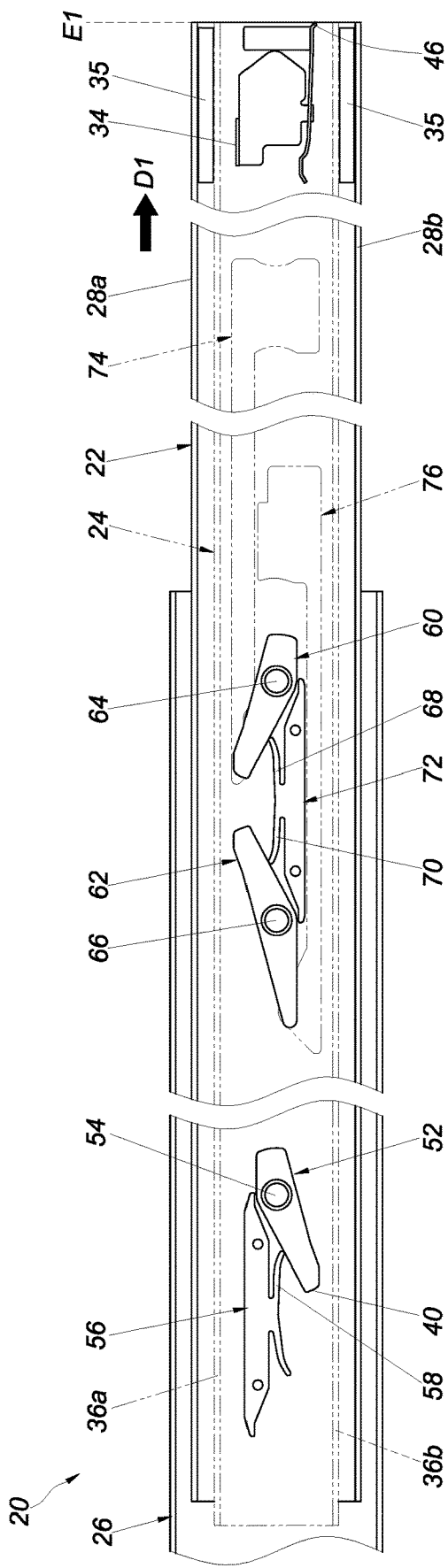
FIG. 5 is a schematic view of the slide rail assembly according to the embodiment of the present invention, showing that the first rail and the second rail of the slide rail assembly is displaced with respect to the third rail in an opening direction.

In FIG. 5, the first rail 22 reaches a first extended position E1 with respect to the third rail 26 after being displaced with respect to the third rail 26 in an opening direction D1.

Figure 6:
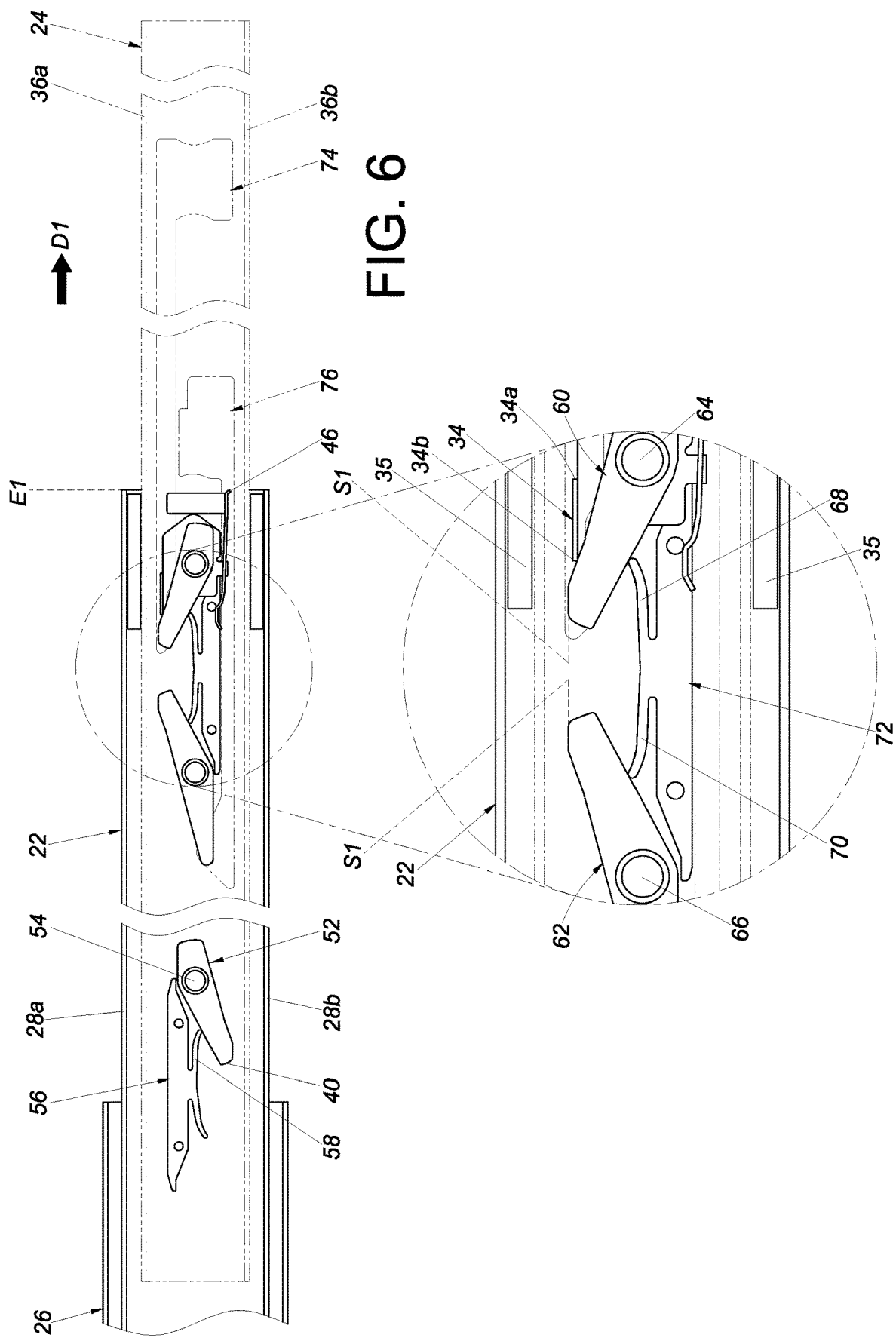
FIG. 6 is a schematic view of the slide rail assembly according to the embodiment of the present invention, showing that the first rail of the slide rail assembly is at a first extended position with respect to the third rail, and that the second rail is displaced with respect to the first rail in the opening direction.

When the first rail 22 is at the first extended position E1 with respect to the third rail 26, referring to FIG. 6, the second rail 24 can be displaced with respect to the first rail 22 in the opening direction D1. In the course in which the second rail 24 is displaced with respect to the first rail 22 in the opening direction D1, the first working member 60, which corresponds in position to the blocking feature 34 of the first rail 22, comes into contact with the second portion 34b of the blocking feature 34 such that a force acts on the first working member 60.

Figure 7:
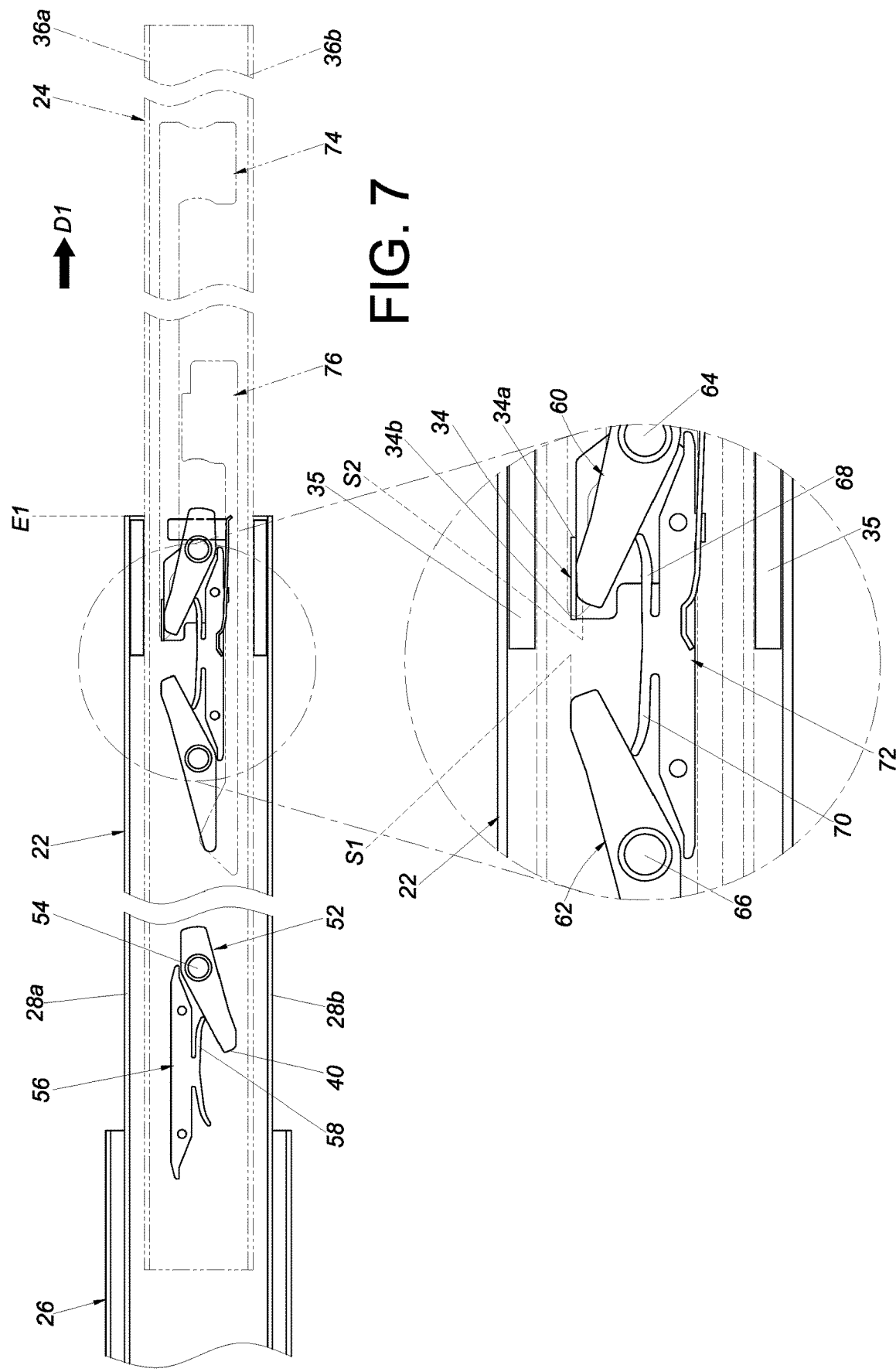
FIG. 7 is a schematic view of the slide rail assembly according to the embodiment of the present invention, showing that the first rail of the slide rail assembly is at the first extended position with respect to the third rail, and that the second rail is further displaced with respect to the first rail in the opening direction.

When the second rail 24 is further displaced with respect to the first rail 22 in the opening direction D1, referring to FIG. 6 and FIG. 7, the force acting on the first working member 60 rotates the first working member 60 through an angle and thereby brings the first working member 60 from the first working state S1 (see FIG. 6) to a second working state S2 (see FIG. 7), and the first working member 60 moves past the second portion 34b of the blocking feature 34 as a result. The first elastic feature 68 in this state stores an elastic force (see FIG. 7).

Figure 8:
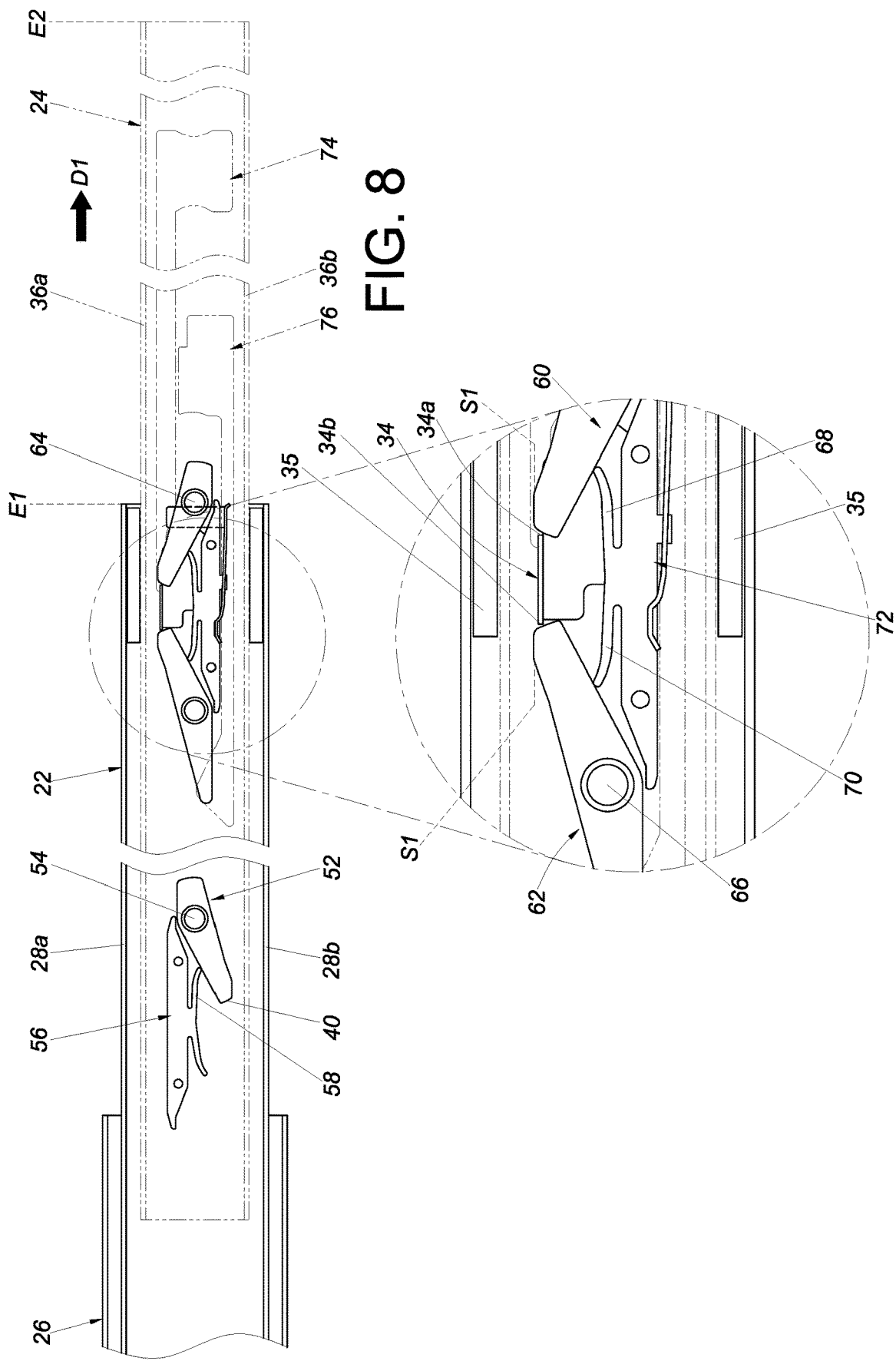
FIG. 8 is a schematic view of the slide rail assembly according to the embodiment of the present invention, showing that the slide rail assembly is in the extended state.
Figure 9:
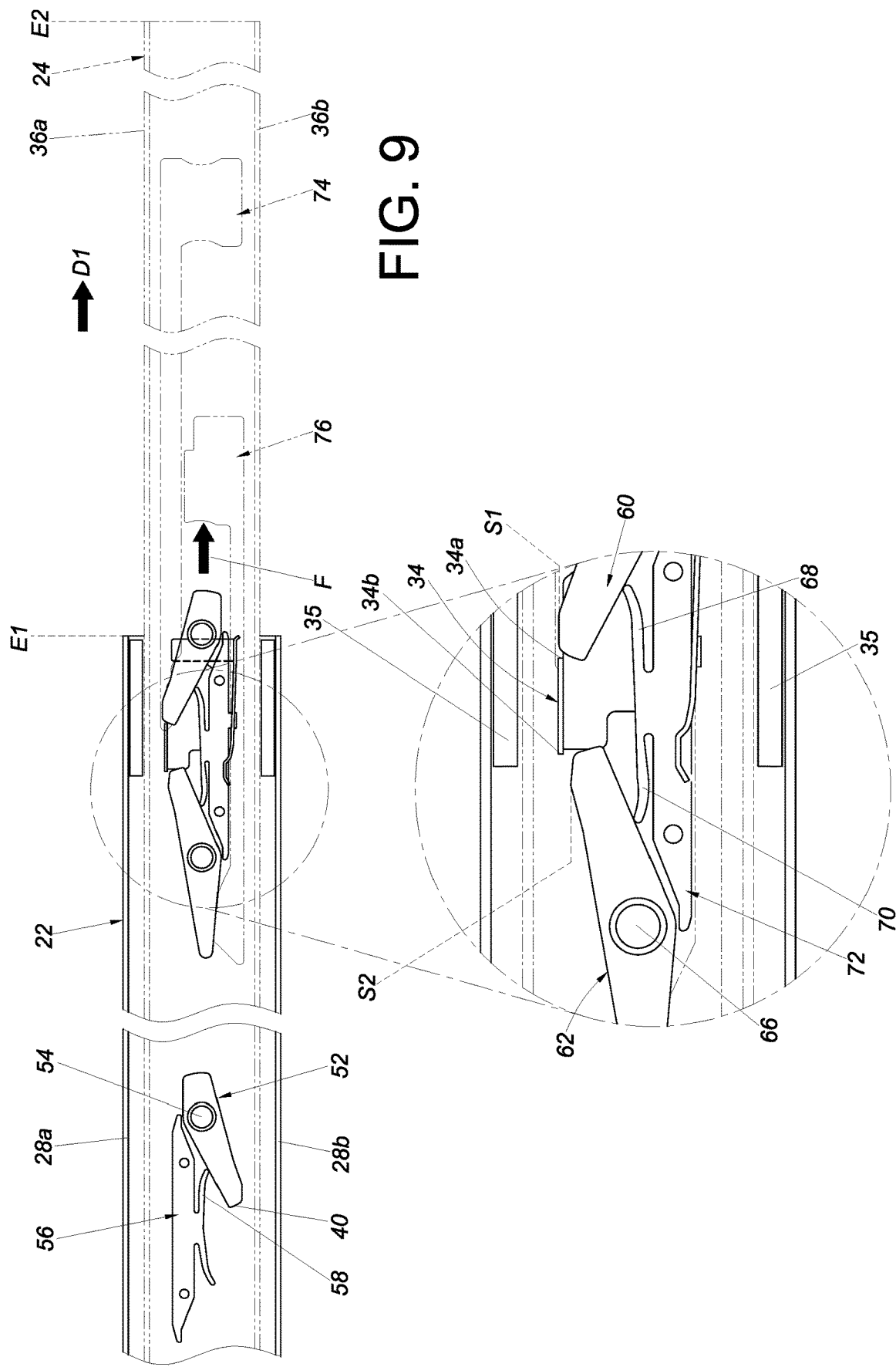
FIG. 9 is a schematic view of the slide rail assembly according to the embodiment of the present invention, showing that the slide rail assembly is in the extended state, and that one of the working members is operated via the corresponding operating member.

When the second rail 24 reaches a second extended position E2 with respect to the first rail 22 after being further displaced with respect to the first rail 22 in the opening direction D1, referring to FIG. 7 and FIG. 8, the first working member 60 returns to the first working state S1 in response to the first elastic feature 68 releasing the elastic force stored therein and ends up at the first portion 34a of the blocking feature 34 (see FIG. 8). On the other hand, the second working member 62, which remains in the first working state S1 and hence corresponds in position to the blocking feature 34 of the first rail 22, is brought into contact with the second portion 34b of the blocking feature 34. Consequently, the first working member 60 and the second working member 62 are both in the first working state S1 and are located respectively at the first portion 34a and the second portion 34b of the blocking feature 34 to keep the second rail 24 at the second extended position E2 (see FIG. 8).

Referring to FIG. 8 to FIG. 11, when the second rail 24 is at the second extended position E2 with respect to the first rail 22 (see FIG. 8), a user may apply a force F (see FIG. 9) to and thereby operate the second operating member 76 in order to drive the second working member 62 from the first working state S1 into the second working state S2 (see FIG. 9 and FIG. 10), allowing the second rail 24 to be detached from the second extended position E2 with respect to the first rail 22 in the opening direction D1 (see FIG. 11), i.e., to be separated from the channel 32 of the first rail 22. Now that the foolproof member 52 does not correspond in position to the blocking feature 34 of the first rail 22 (i.e., the foolproof feature 40 is offset from the blocking feature 34), the blocking feature 34 will not block the foolproof member 52 while the second rail 24 is being displaced in the opening direction D1. Moreover, the guiding surface 53 allows the foolproof member 52 to move past the engaging portion 49 of the elastic arm 47.

Referring to FIG. 11, FIG. 12, and FIG. 13, the blocking feature 34 is adjacent to the first wall 28a of the first rail 22, and the foolproof feature 40 is adjacent to the second wall 36b of the second rail 24. The second rail 24 can be mounted back into the channel 32 of the first rail 22 in a retracting direction D2 from outside the channel 32 of the first rail 22. For example, a proper mounting process may involve placing the first wall 36a of the second rail 24 adjacent to the first wall 28a of the first rail 22 and then inserting the second rail 24 into the channel 32 of the first rail 22 in the retracting direction D1, and during the process, the foolproof feature 40 and the blocking feature 34 will not block each other.

More specifically, as the guiding feature 46 is adjacent to the second wall 28b of the first rail 22, the foolproof member 52 will be guided and moved by the guiding feature 46 (e.g., pivoted through an angle as shown in FIG. 13) and eventually move past the guiding feature 46 while the second rail 24 is being inserted into the channel 32 of the first rail 22 with the first wall 36a of the second rail 24 being adjacent to the first wall 28a of the first rail 22. Once the foolproof member 52 moves past the guiding feature 46, the second rail 24 will be able to be retracted with respect to the first rail 22 in the retracting direction D2. While the foolproof member 52 is being guided by the guiding feature 46, referring to FIG. 13, the elastic section 58 of the elastic member 56 preferably stores an elastic force in response to the movement of the foolproof member 52 and thereby allows the foolproof member 52 to leave the aforesaid predetermined state, making it possible to retract the second rail 24 with respect to the first rail 22 in the retracting direction D2 until the retracted position R is reached, as shown in FIG. 4.

FIG. 14 and FIG. 15 show a mounting process different from the one shown in FIG. 12 and FIG. 13, wherein the difference can be understood as follows. An object is carried by a pair of slide rail assemblies of the present invention and has one slide rail assembly mounted on each of its left and right sides. The mounting process shown in FIG. 12 and FIG. 13 is a correct one, carried out on the left side of the object, whereas the mounting process shown in FIG. 14 and FIG. 15 is performed incorrectly on the right side of the object by turning the second rail 24 of the left-side slide rail assembly through a predetermined angle and inserting this second rail 24 into the right-side slide rail assembly, i.e., into another first rail 200 having substantially the same structural configuration as the first rail 22 described above.

More specifically, in the erroneous mounting process shown in FIG. 14 and FIG. 15, the second rail 24 is turned through the predetermined angle with respect to the first rail 200 and therefore cannot be mounted into the channel 32 of the first rail 200 in the retracting direction D2 from outside the channel 32 of the first rail 200. For example, while the second rail 24 is being inserted into the channel 32 of the first rail 200 in the retracting direction D2 from outside the channel 32 of the first rail 200, with the first wall 36a of the second rail 24 being adjacent to the second wall 28b of the first rail 200, the foolproof feature 40 and the blocking feature 34 (or more particular its first portion 34a) of the first rail 200 will block each other (see FIG. 15), thus preventing the second rail 24 from being retracted with respect to the first rail 200 in the retracting direction D2, let alone reaching the retracted position R. The aforesaid predetermined angle is substantially 180 degrees; for example, the first wall 36a and the second wall 36b of the second rail 24 in FIG. 14 and FIG. 15 are located at a lower position and an upper portion of the longitudinal wall 38 of the second rail 24 respectively, whereas the first wall 36a and the second wall 36b of the second rail 24 in FIG. 12 and FIG. 13 are located at an upper position and a lower portion of the longitudinal wall 38 of the second rail 24 respectively.

It can be known from the above that the slide rail assembly 20 according to the foregoing embodiment preferably has the following features:

1. The foolproof feature 40 and the blocking feature 34 can work together to prevent the second rail 24 from being mounted incorrectly into the channel 32 of the first rail 22 (200).

2. When the left and right sides of a rack system (or a drawer system) are each provided with a slide rail assembly 20 of the foregoing structural configuration (e.g., a first slide rail assembly on the left and a second slide rail assembly on the right), the foolproof features 40 and the blocking features 34 of the two slide rail assemblies can work together to ensure that the second rail 24 of the left-side first slide rail assembly can only be mounted in the channel 32 of the first rail 22 of the left-side first slide rail assembly and cannot be mounted in the channel 32 of the first rail 200 of the right-side second slide rail assembly, and that the same applies to the second rail 24 of the right-side second slide rail assembly.

While the present invention has been disclosed through the preferred embodiment described above, the embodiment is not intended to be restrictive of the scope of the invention. The scope of the patent protection sought by the applicant is defined by the appended claims.

What is claimed is:
1. A slide rail assembly, comprising:
 a first rail including a first wall, a second wall, and a longitudinal wall connected between the first wall and the second wall of the first rail, wherein the first wall, the second wall, and the longitudinal wall of the first rail jointly define a channel;
 a blocking member fixed on the first rail at a position adjacent to a front end of the first rail, wherein the blocking member has a blocking feature;
 a second rail including a first wall, a second wall, and a longitudinal wall connected between the first wall and the second wall of the second rail; and
 a foolproof member movably mounted on the second rail, wherein the foolproof member has a foolproof feature at a position adjacent to the second wall of the second rail;
 an elastic member generating an elastic force applied to the foolproof member to bias the foolproof member in a predetermined state;
 a guiding feature adjacent to the second wall of the first rail so that while the second rail is being inserted into the channel of the first rail, with the first wall of the second rail being adjacent to the first wall of the first rail, the foolproof member is guided and moved by the guiding feature and moves past the guiding feature, thereby allowing the second rail to be retracted with respect to the first rail; and an elastic arm mounted on the first rail, wherein the elastic arm has two opposite ends provided respectively with the guiding feature and an engaging portion; when the second rail, after being retracted with respect to the first rail, is pulled out with respect to the first rail in an opening direction, which is the opposite direction of the retracting direction, and thereby displaces a slide facilitating device on the first rail, the engaging portion is brought into engagement with the slide facilitating device; and while the second rail is being pulled out, the foolproof member moves past the engaging portion by means of a guiding surface of the foolproof member; wherein while the second rail is being inserted into the channel of the first rail in a retracting direction from outside the channel of the first rail, with the first wall of the second rail being adjacent to the first wall of the first rail, the foolproof feature and the blocking feature do not block each other and therefore allow the second rail to be retracted with respect to the first rail.

2. The slide rail assembly of claim 1, wherein the foolproof member is pivotally connected to the second rail.

3. The slide rail assembly of claim 1, further comprising a first working member and a second working member, both movably mounted on the second rail, wherein when the second rail reaches an extended position after displacement with respect to the first rail from a retracted position in an opening direction, the first working member and the second working member are located respectively at a first portion and a second portion of the blocking feature to keep the second rail at the extended position.

4. The slide rail assembly of claim 3, wherein the first working member is pivotally connected to the second rail by a first shaft, the second working member is pivotally connected to the second rail by a second shaft, and the slide rail assembly further comprises a first elastic feature for applying an elastic force to the first working member and a second elastic feature for applying an elastic force to the second working member.

5. The slide rail assembly of claim 4, further comprising a first operating member and a second operating member, wherein the first operating member and the second operating member are connected respectively to the first working member and the second working member in an operable manner.

* * * * *